(12) United States Patent
Nakata et al.

(10) Patent No.: US 10,770,376 B2
(45) Date of Patent: Sep. 8, 2020

(54) SEMICONDUCTOR DEVICE, INVERTER UNIT AND AUTOMOBILE

(71) Applicant: Mitsubishi Electric Corporation, Tokyo (JP)

(72) Inventors: Yosuke Nakata, Tokyo (JP); Yuji Imoto, Tokyo (JP); Taishi Sasaki, Tokyo (JP); Tatsuya Kawase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/317,716

(22) PCT Filed: Nov. 11, 2016

(86) PCT No.: PCT/JP2016/083541
§ 371 (c)(1),
(2) Date: Jan. 14, 2019

(87) PCT Pub. No.: WO2018/087890
PCT Pub. Date: May 17, 2018

(65) Prior Publication Data
US 2019/0295932 A1    Sep. 26, 2019

(51) Int. Cl.
*H01L 23/495* (2006.01)
*H01L 23/31* (2006.01)
(Continued)

(52) U.S. Cl.
CPC ........ *H01L 23/49537* (2013.01); *H01L 23/28* (2013.01); *H01L 23/3107* (2013.01);
(Continued)

(58) Field of Classification Search
CPC ............... H01L 23/3735; H01L 24/73; H01L 23/48562; H01L 23/49568;
(Continued)

(56) References Cited

U.S. PATENT DOCUMENTS 6,441,317 B1    8/2002  Tanaka et al.
2010/0238627 A1    9/2010  Shinohara
(Continued)

FOREIGN PATENT DOCUMENTS

JP    H01-107144 U    7/1989
JP    2001-135788 A    5/2001
(Continued)

OTHER PUBLICATIONS

International Search Report; Written Opinion; and Notification of Transmittal of the International Search Report and the Written Opinion of the International Searching Authority, or the Declaration issued in PCT/JP2016/083541; dated Jan. 24, 2017.

*Primary Examiner* — Jasmine J Clark
(74) *Attorney, Agent, or Firm* — Studebaker & Brackett PC

(57) ABSTRACT

A semiconductor chip (2a) is bonded to an upper surface of the conductive substrate (1a). A control terminal (11a) is disposed outside the semiconductor chip (2a) and connected to a control electrode of the semiconductor chip (2a) via a lead (12a). A case (10) surrounds the semiconductor chip (2a). A sealing material (13) seals the semiconductor chip (2a). The lead frame (4) includes a bonded part (4a) joined to the semiconductor chip (2a), and an upright part (4b) embedded in the case (10), extending from the bonded part (4a) to an outer side of the control terminal (11a), and standing upright vertically relative to an upper surface of the semiconductor chip (2a).

16 Claims, 5 Drawing Sheets

(51) Int. Cl.
*H01L 23/00* (2006.01)
*H01L 23/48* (2006.01)
*H01L 23/50* (2006.01)
*H01L 23/28* (2006.01)
*H01L 25/18* (2006.01)
*H01L 25/07* (2006.01)
*H02M 7/00* (2006.01)

(52) U.S. Cl.
CPC ........ *H01L 23/48* (2013.01); *H01L 23/49551* (2013.01); *H01L 23/49558* (2013.01); *H01L 23/49562* (2013.01); *H01L 23/49568* (2013.01); *H01L 23/49575* (2013.01); *H01L 23/50* (2013.01); *H01L 24/17* (2013.01); *H01L 25/07* (2013.01); *H01L 25/18* (2013.01); *H01L 2224/40137* (2013.01); *H02M 7/003* (2013.01)

(58) Field of Classification Search
CPC ........... H01L 23/49562; H01L 23/3107; H01L 23/28; H01L 23/49575; H01L 25/07; H01L 23/50; H01L 2224/40137; H01L 23/49537; H01L 25/18; H02M 7/003
See application file for complete search history.

(56) References Cited

U.S. PATENT DOCUMENTS

| | | | |
|---|---|---|---|
| 2014/0048918 A1* | 2/2014 | Nagaune | H01L 23/4334 257/675 |
| 2015/0061098 A1 | 3/2015 | Imoto et al. | |
| 2016/0104651 A1 | 4/2016 | Asada et al. | |
| 2016/0111345 A1 | 4/2016 | Kawase et al. | |

FOREIGN PATENT DOCUMENTS

| | | |
|---|---|---|
| JP | 2009-111319 A | 5/2009 |
| JP | 2010-177573 A | 8/2010 |
| JP | 2010-225720 A | 10/2010 |
| JP | 2011-114137 A | 6/2011 |
| JP | 2015-046416 A | 3/2015 |
| JP | 2016-076670 A | 5/2016 |
| WO | 2015/029186 A1 | 3/2015 |
| WO | 2015/152373 A1 | 10/2015 |

\* cited by examiner

SEMICONDUCTOR DEVICE, INVERTER UNIT AND AUTOMOBILE

FIELD

The present invention relates to a semiconductor device that draws electric current by bonding lead frames to semiconductor chips.

BACKGROUND

Semiconductor devices having an integrally molded case and lead frames wherein the lead frames are directly soldered to semiconductor chips to draw electric current have been disclosed (see, for example, PTL 1).

Semiconductor devices that use ribbon bonds for drawing electric current have also been disclosed (see, for example, PTL 2). The ribbon bonds are members that undergo a bending process during the process of being bonded to semiconductor elements. Since the ribbon bonds can be made thicker only to a limited extent, a plurality of ribbon bonds need to be connected in order to achieve a certain current to be conducted, which causes the device to be bulky. Lead frames, on the other hand, are obtained by forming plate materials having a cross-sectional area corresponding to a current to be conducted, into a desired shape by stamping and bending before the process of connecting the lead frames to semiconductor elements, and are connected to the semiconductor elements with a solder material, for example. A single lead frame is used for one or more semiconductor elements to draw electric current.

A semiconductor device having main terminals for drawing electric current provided vertically in the center has been disclosed (see, for example, PTL 3). This semiconductor device does not allow a control circuit to be directly connected thereabove. Bus bars are therefore necessary to draw electric current from the semiconductor device to the outside for connection with a control substrate, because of which the number of constituent parts and the device size are increased. The main terminals are set vertically for guaranteeing insulation and it is a common structure in high voltage products having a breakdown voltage of 1,700 V or more, for example. The necessity to guarantee insulation, however, makes it hard to provide control terminals in close proximity. Semiconductor devices for automobiles are driven by batteries mounted inside the automobile and they only need to have a breakdown voltage of not more than 1,400 V. Since such semiconductor devices do not require the high voltage design concept mentioned above, the main electrodes are extended out to the outside of the control terminals of the semiconductor device. Therefore, a control substrate can be attached directly to the semiconductor device and electric current can still be input and output to and from the semiconductor device.

CITATION LIST

Patent Literature

[PTL 1] WO 2015/029186
[PTL 2] Japanese Patent Application Laid-open No. 2011-114137
[PTL 3] Japanese Patent Application Laid-open No. 2001-135788

SUMMARY

Technical Problem

To accommodate an increase in the current capacity, the cross-sectional area of the lead frames needs to be increased. The thicker the lead frames are, however, the larger the stress applied from the lead frames. Moreover, the thickness can be increased only to a limited extent because of the need to form the lead frames into a desired shape by bending. Accordingly, it was the lateral width of the lead frames that had to be extended.

To achieve a large current capacity, it is also necessary to make a plurality of semiconductor chips operate in parallel. This in turn requires provision of control terminals to each of the plurality of semiconductor chips for supplying control signals. The number of control terminals is accordingly increased, because of which sufficient space was not available for the lead frames to extend to the outside of the control terminals.

To draw electric current from a plurality of semiconductor devices, the frame width need to be extended to accommodate the increased current capacity, causing a further increase in size of the semiconductor device. When extracting a single output from a plurality of semiconductor chips, they need not be spaced apart from each other for insulation as much as when extracting different phase outputs, and the chips are disposed closer together. There was thus no sufficient space for the lead frames to extend to the outside of the control terminals.

The widths of control terminals and lead frames were key issues that limited downsizing of semiconductor devices having SiC semiconductor chips, in particular, in high current applications, and were an impediment to reduction of size, inductance, and cost.

The present invention was made to solve the problems described above and it is an object of the invention to provide a semiconductor device that allows for an increase in the widths of lead frames without increasing the mounting surface area, and to provide an inverter unit and an automobile.

Solution to Problem

A semiconductor device according to the present invention includes: a conductive substrate; a semiconductor chip bonded to an upper surface of the conductive substrate; a control terminal disposed outside the semiconductor chip and connected to a control electrode of the semiconductor chip via a lead; a case surrounding the semiconductor chip; a lead frame; and a sealing material sealing the semiconductor chip, wherein the lead frame includes a bonded part joined to the semiconductor chip, and an upright part embedded in the case, extending from the bonded part to an outer side of the control terminal, and standing upright vertically relative to an upper surface of the semiconductor chip.

Advantageous Effects of Invention

In the present invention, the upright part of the lead frame stands vertically relative to the upper surface of the semiconductor chip. This allows for an increase in the width of the lead frame without increasing the mounting surface area.

DESCRIPTION OF EMBODIMENTS

A semiconductor device, an inverter unit and an automobile according to the embodiments of the present invention will be described with reference to the drawings. The same components will be denoted by the same symbols, and the repeated description thereof may be omitted.

Embodiment 1

Figure 1:
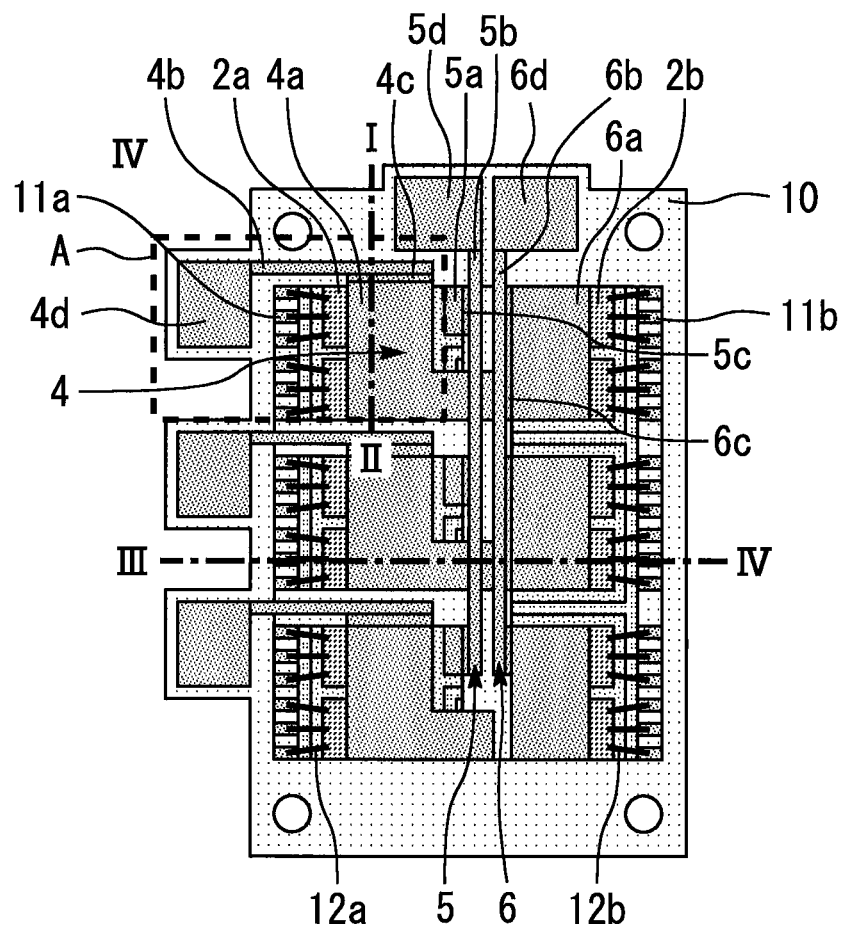
FIG. 1 is a plan view illustrating a semiconductor device according to Embodiment 1 of the present invention.
Figure 2:
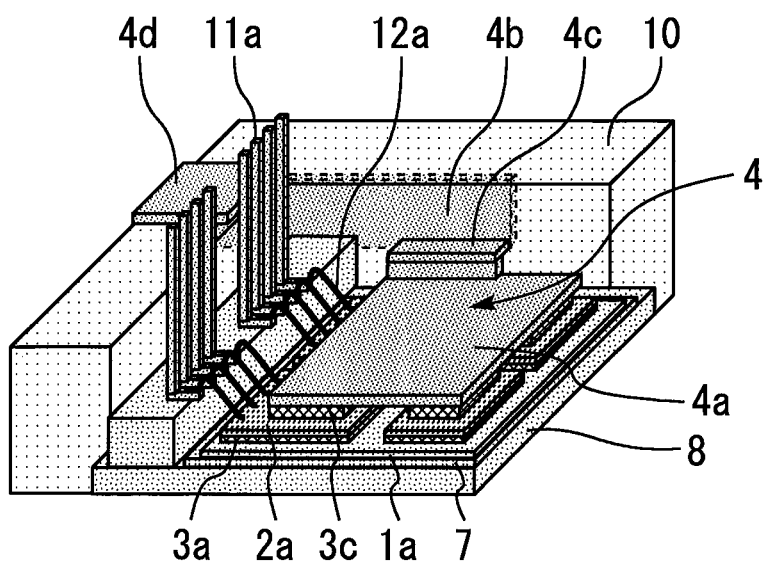
FIG. 2 is an enlarged perspective view of region A of FIG. 1.
Figure 3:
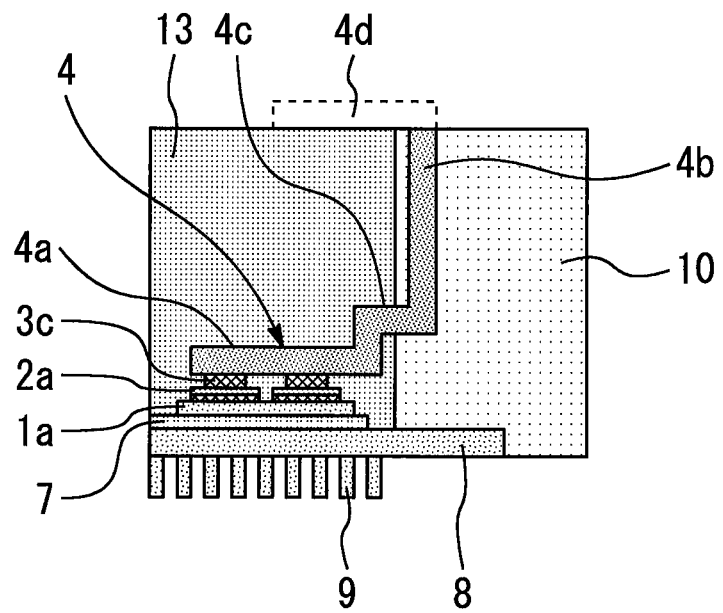
FIG. 3 is a cross-sectional view along I-II of FIG. 1.
Figure 4:
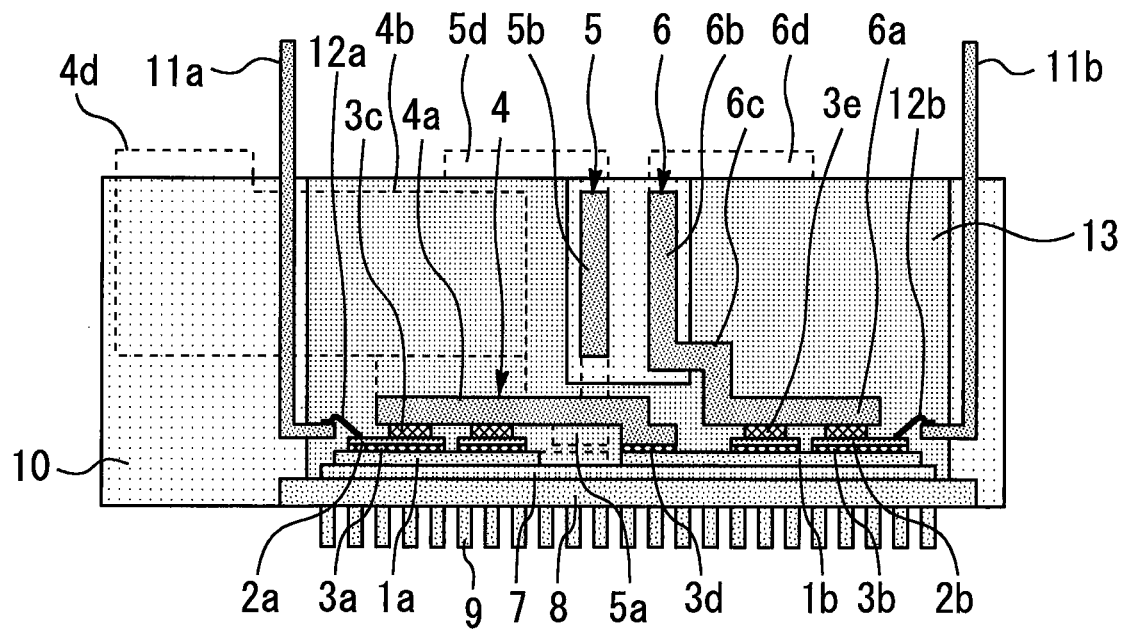
FIG. 4 is a cross-sectional view along of FIG. 1.
Figure 5:
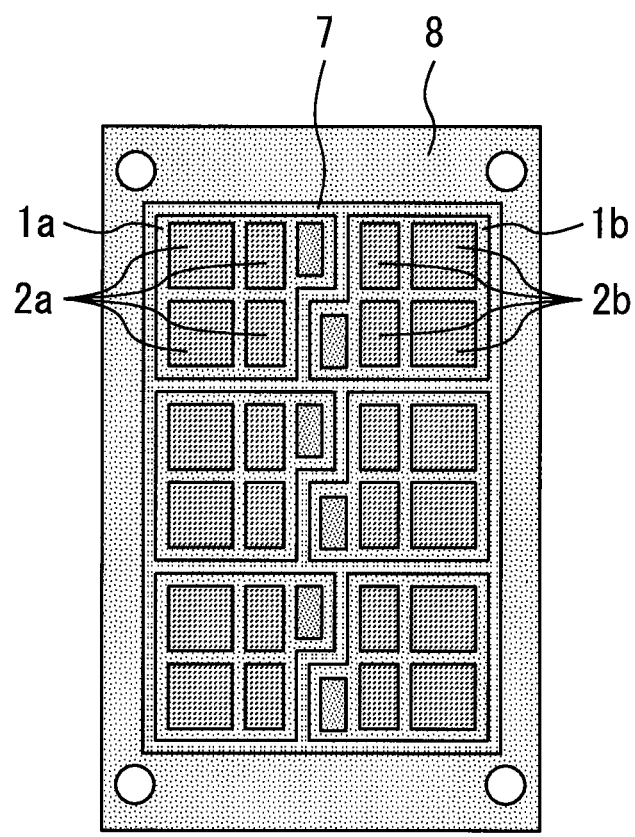
FIG. 5 is a plan view showing the arrangement of semiconductor chips on the semiconductor device of FIG. 1.

FIG. 1 is a plan view illustrating a semiconductor device according to Embodiment 1 of the present invention. FIG. 2 is an enlarged perspective view of region A of FIG. 1. FIG. 3 is a cross-sectional view along I-II of FIG. 1. FIG. 4 is a cross-sectional view along III-IV of FIG. 1. FIG. 5 is a plan view showing the arrangement of semiconductor chips on the semiconductor device of FIG. 1.

A plurality of semiconductor chips 2a are arranged adjacent each other on a conductive substrate 1a. A plurality of semiconductor chips 2b are arranged adjacent each other on a conductive substrate 1b. Lower surface electrodes of the semiconductor chips 2a are bonded to an upper surface of the conductive substrate 1a with solder 3a. Lower surface electrodes of the semiconductor chips 2b are bonded to an upper surface of the conductive substrate 1b with solder 3b.

A lower surface of a lead frame 4 is bonded to upper surface electrodes of the plurality of semiconductor chips 2a with solder 3c, and to the upper surface of the conductive substrate 1b with solder 3d. A lead frame 5 is bonded to the conductive substrate 1a, and electrically connected to the lower surface electrodes of the semiconductor chips 2a via the conductive substrate 1a. A lower surface of a lead frame 6 is bonded to the upper surface electrodes of the plurality of semiconductor chips 2b with solder 3e, and electrically connected to the upper surface electrodes of the semiconductor chips 2b.

The semiconductor chips 2a and 2b thus output electric current. The upper surface electrodes and lower surface electrodes of the semiconductor chips 2a and 2b are made of a material containing nickel and can be formed by wet plating, by sputtering or by a deposition method such as vapor deposition.

The semiconductor chips 2a form an upper arm, while the semiconductor chips 2b form a lower arm. Three sets of these combinations of upper and lower arms are arranged side by side, whereby a six-phase full-wave bridge rectifier circuit is configured by a single semiconductor device.

An insulating substrate 7 is provided on the underside of the conductive substrates 1a and 1b. This insulating substrate 7 provides easy insulation between the semiconductor chips 2a and 2b and the outside, and improves the handling ease and reliability of the semiconductor device.

A cooling plate 8 is provided on the underside of the insulating substrate 7. The cooling plate 8 has a plurality of protrusions 9 on the underside for cooling purposes. The cooling plate 8 itself therefore becomes a cooling fin and can efficiently cool the semiconductor device directly with cooling water therein. Alternatively, the cooling plate 8 may be thermally coupled to cooling fins via heat dissipation grease, for example. Cooling of the semiconductor device can be achieved this way in a simple assembly.

A case 10 surrounds the semiconductor chips 2a and 2b. A plurality of control terminals 11a are disposed outside the area of the semiconductor chips 2a. A plurality of control terminals 11b are disposed outside the area of the semiconductor chips 2b. The control terminals 11a and 11b are integral with the case 10, with their terminal parts and pads exposed from the case 10. The terminal parts of the control terminals 11a and 11b are connected to an external control substrate. The pads of the control terminals 11a are connected to control electrodes of the semiconductor chips 2a via leads 12a such as aluminum wires. The pads of the control terminals 11b are connected to control electrodes of the semiconductor chips 2b via leads 12b such as aluminum wires. Thus the semiconductor chips 2a and 2b can be controlled by the external control substrate. The control terminals 11a and 11b are provided in the same numbers as those of the control electrodes on the surfaces of the plurality of semiconductor chips 2a and 2b.

A sealing material 13 seals the semiconductor chips 2a and 2b. Parts of the lead frames 4, 5, and 6 are also covered by the sealing material 13. Insulation between the lead frames 4, 5, and 6 and the conductive substrates 1a and 1b and control terminals 11a and 11b is thus readily achieved, which improves the yield rate of the mounting process and reliability.

The lead frame 4 includes a bonded part 4a, an upright part 4b, a stress reducing part 4c, and a current input/output part 4d. The lead frame 5 includes a bonded part 5a, an upright part 5b, a stress reducing part 5c, and a current input/output part 5d. The lead frame 6 includes a bonded part 6a, an upright part 6b, a stress reducing part 6c, and a current input/output part 6d. The lead frames 4, 5, and 6 are made of a material primarily composed of copper, for example. The bonded parts 4a, 5a, and 6a and upright parts 4b, 5b, and 6b and so on are formed by bending, after the frames are cut out from a rolled copper plate into a desired shape in a pressing process.

The bonded part 4a is joined to the upper surfaces of the semiconductor chips 2a, and extends from the semiconductor chips 2a toward the case 10. The upright part 4b is embedded in the case 10 from the bonded part 4a to the outer side of the control terminals 11a and 11b where it comes out, and stands upright vertically relative to the upper surfaces of the semiconductor chips 2a and 2b.

The bonded part 5a is joined to the upper surface of the conductive substrate 1a. The upright part 5b is embedded in the case 10, is pulled out from the bonded part 5a to the outer side of the control terminals 11a and 11b, and stands upright vertically relative to the upper surfaces of the semiconductor chips 2a and 2b. The bonded part 6a is joined to the upper surfaces of the semiconductor chips 2b, and extends from the semiconductor chips 2b toward the case 10. The upright part 6b is embedded in the case 10, is pulled out from the bonded part 6a to the outer side of the control terminals 11a and 11b, and stands upright vertically relative to the upper surfaces of the semiconductor chips 2a and 2b.

The stress reducing part 4c connects the bonded part 4a and the upright part 4b. The stress reducing part 5c connects the bonded part 5a and the upright part 5b. The stress reducing part 6c connects the bonded part 6a and the upright part 6b. The stress reducing parts 4c, 5c, and 6c are formed in a step-like shape, for example, by bending the lead frames 4, 5, and 6. The stress reducing parts 4c, 5c, and 6c can reduce stress applied to the semiconductor chips 2a, conductive plate 1a, and semiconductor chips 2b when the lead frames 4, 5, and 6 are bonded to the semiconductor chips 2a, conductive plate 1a, and semiconductor chips 2b, respectively. This can help increase the yield rate of production and reliability of the semiconductor device with reduced mounting area.

The current input/output parts 4d, 5d, and 6d are positioned outside the semiconductor device from the control terminals 11a and 11b and formed by bending the upright parts 4b, 5b, and 6b perpendicularly so that they are parallel to the upper surfaces of the semiconductor chips 2a and 2b. For example, grooves are formed in the case 10, and nuts are fitted into the grooves. The lead frames 4, 5, and 6 are bent to form the current input/output parts 4d, 5d, and 6d such that they close the grooves. This allows the current input/output parts 4d, 5d, and 6d to be fastened with external electrodes with screws.

In this embodiment, the upright parts 4b, 5b and 6b of the lead frames 4, 5, and 6 stand vertically relative to the upper surfaces of the semiconductor chips 2a and 2b. This allows for an increase in the widths of the lead frames 4, 5, and 6 without increasing the mounting surface area. Therefore, the cross sectional areas of the lead frames 4, 5, and 6 can be increased correspondingly to a large current capacity. Also, parasitic inductance can be reduced, which enables reduction of the surge voltage that occurs during switching of the semiconductor chips 2a and 2b.

The lead frames allow themselves to be disposed also in designs where a plurality of parallel-driven semiconductor chips are arranged close together. This embodiment is therefore effective for semiconductor devices where semiconductor chips are driven in parallel to achieve a single output.

The case is formed by insert molding wherein the case resin is injected while the lead frames 4, 5, and 6 and control terminals 11a and 11b are fixed by the mold to integrate the lead frames 4, 5, and 6 and control terminals 11a and 11b with the case 10. As the lead frames 4, 5, and 6 can be set in position in this way, the position accuracy of the lead frames 4, 5, and 6 is improved. Insulation between the lead frames 4, 5, and 6 is also guaranteed, so that the mounting yield rate and reliability are improved. At least the bonded parts 4a, 5a, and 6a, stress reducing parts 4c, 5c, and 6c, and current input/output parts 4d, 5d, and 6d of the lead frames 4, 5, and 6 are exposed from the case 10. The lead frames 4, 5, and 6 are spaced apart from each other by a distance large enough for the case resin to exhibit sufficient insulating and voltage-blocking capabilities. If the case resin is PPS, for example, the lead frames should preferably be spaced apart by 1 mm or more in consideration of insulation and voltage blocking ability as well as the embeddability in PPS and production tolerances of the spacing between the lead frames.

For accommodating a larger electric current, a plurality of semiconductor chips 2a are connected in parallel for one switching phase. The lead frame 4 draws one AC output from the plurality of semiconductor chips 2a. The current capacity can be increased this way by driving a plurality of semiconductor chips in parallel. While the number of the control terminals 11a and 11b is increased with an increase in the number of chips driven in parallel, the problem of limited space that has to be shared with the lead frames 4, 5, and 6 is resolved by this embodiment, and thus the mounting surface area can be decreased.

The upright part 5b of the lead frame 5 and the upright part 6b of the lead frame 6 face each other via the case resin that forms an insulating layer. The distance between the lead frames 5 and 6 can thus be reduced to increase the overlapping region, so that the parasitic inductance can be decreased. This suppresses the surge voltage during switching.

Embodiment 2

Figure 6:
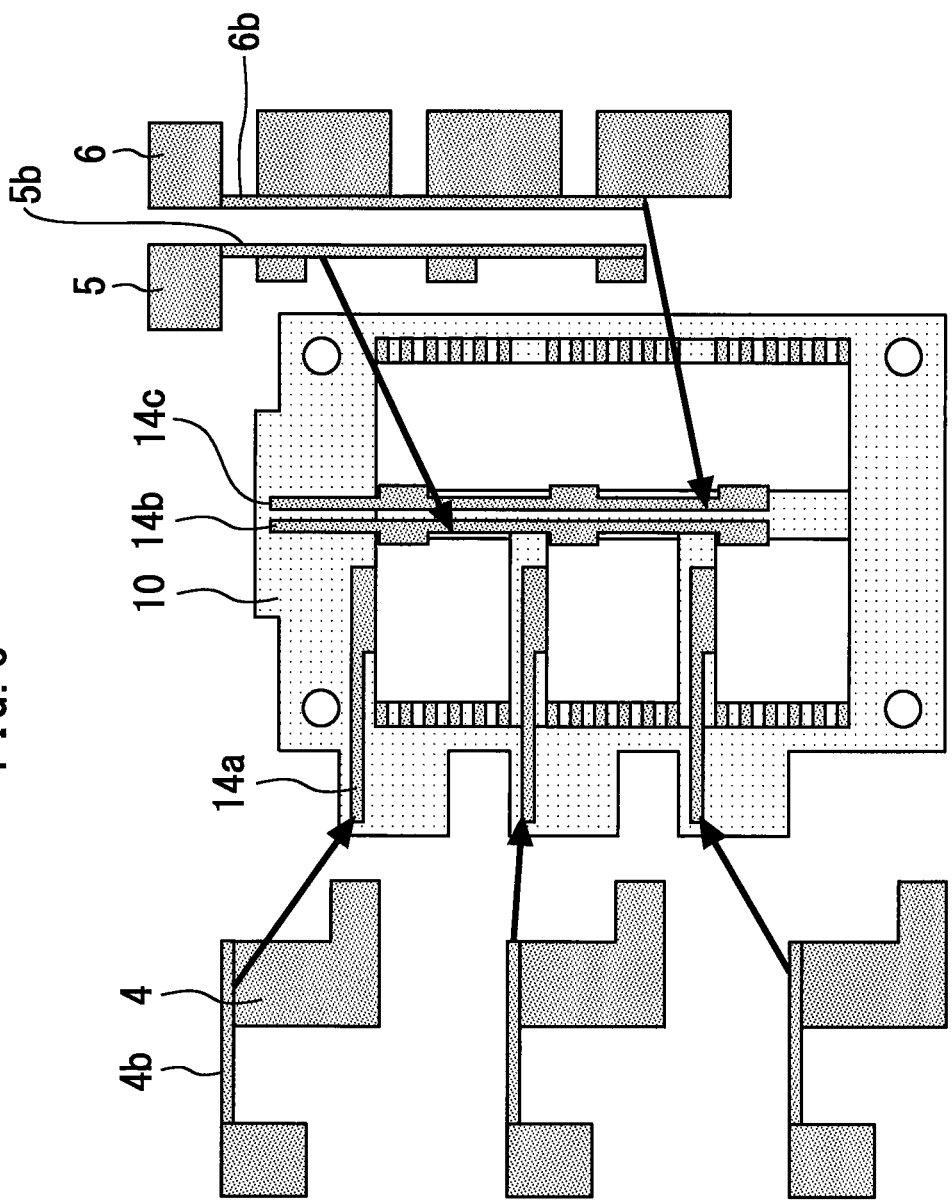
FIG. 6 is a plan view illustrating lead frames and a case according to Embodiment 2 of the present invention detached from each other.

FIG. 6 is a plan view illustrating lead frames and a case according to Embodiment 2 of the present invention detached from each other. The lead frames 4, 5, and 6 are fitted to the case 10. The case 10 is provided with slits 14a, 14b, and 14c for receiving the lead frames 4, 5, and 6 fitted therein, respectively. By inserting the upright parts 4b, 5b, and 6b of the lead frames 4, 5, and 6 into the slits 14a, 14b, and 14c, respectively, the lead frames can be set in position.

When the number or size of parallel-operating semiconductor chips 2a and 2b is to be changed, normally, the stamping dies and bending dies for the lead frames 4, 5, and 6, and the molding dies for the case 10, are each altered. Since the molding dies for the case 10 tend to be large and can lead to an increase in the production cost, it is preferable that the molds for the case 10 need no alteration. As in this embodiment, by fabricating the case 10 and lead frames 4, 5, and 6 separately, it is possible to accommodate design variations in the semiconductor device by changing only the shapes of the lead frames 4, 5, and 6 and without changing the shape of the case 10.

The lead frames 4, 5, and 6 fitted to the case 10 allow a degree of freedom substantially in the vertical direction of the semiconductor chips 2a and 2b. As compared, for example, to lead frames 4, 5, and 6 integral with the case 10, stress can be released when bonding the lead frames 4, 5, and 6 to the semiconductor chips 2a and 2b with solder. This consequently can improve the production yield rate and reliability of the semiconductor device. The lead frames 4, 5, and 6 should preferably be positioned accurately as viewed in plan, and this can be guaranteed by the tolerances of the slits provided in the case 10. Thus the lead frames 4, 5, and 6 can have a freedom of movement in the vertical direction without significantly compromising the position accuracy of the lead frames 4, 5, and 6.

Parts of the lead frames 4, 5, and 6, e.g., at least the upright parts 4b, 5b, and 6b that are inserted into the slits 14a, 14b, and 14c may be pre-coated with a material similar to that of the case 10. As for the pair of lead frames 5 and 6 disposed in close proximity to each other, they should preferably be integrated with each other with the resin case in advance, for they require a certain position accuracy relative to each other.

Embodiment 3

Figure 7:
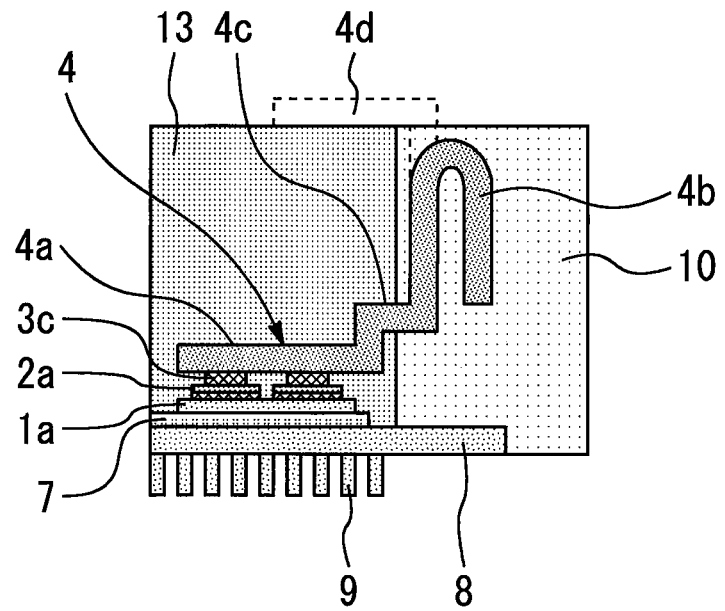
FIG. 7 is a cross-sectional view illustrating a semiconductor device according to Embodiment 3 of the present invention.
Figure 8:
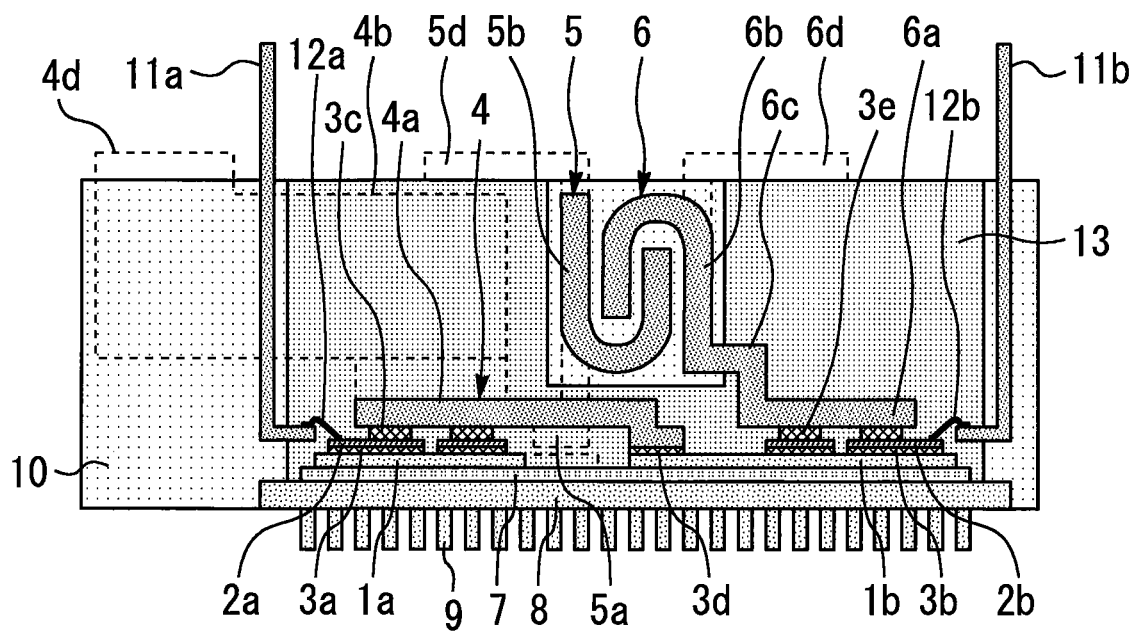
FIG. 8 is a cross-sectional view illustrating a semiconductor device according to Embodiment 3 of the present invention.

FIG. 7 and FIG. 8 are cross-sectional views illustrating a semiconductor device according to Embodiment 3 of the present invention. FIG. 7 corresponds to a cross section along I-II of FIG. 1, and FIG. 8 corresponds to a cross section along III-IV of FIG. 1. The upright parts 4b, 5b, and 6b of the lead frames 4, 5, and 6 are bent in a U-shape. This enables the widths of the lead frames 4, 5, and 6 to be broadened in accordance with the current to be conducted without increasing the vertical dimension of the package, i.e., the height of the semiconductor device.

For semiconductor devices configuring a half-bridge or full-bridge circuit, the lead frames 5 and 6 connected to capacitors should preferably be disposed close to each other for reduction of device size and parasitic inductance. Each of the U-shaped parts of the lead frames 5 and 6 has an opening for the case resin to enter. The lead frames are arranged such that the openings of their U-shaped parts overlap each other, and secured with the case resin. As the overlapped region is further increased this way, the parasitic inductance can be further reduced. This can also guarantee the position accuracy and insulation between the lead frames. If the case resin is PPS, for example, the lead frames need to be spaced away only by about 0.1 mm for the case resin to fill the gaps. To prevent air entrapment inside the U-shape and to promote resin filling, a through hole should preferably be provided in the bottom of the U-shape.

The semiconductor devices according to Embodiments 1 to 3 are used in an inverter unit installed in an automobile housing as a power source for driving an automobile power motor. The inverter unit can accordingly be made smaller and accommodated in the automobile housing as an integral unit with a motor module or a battery module, for example.

The semiconductor chips 2a and 2b are IGBTs, MOS-FETs, Schottky barrier diodes, and the like. The semiconductor chips 2a and 2b are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Meanwhile, ringing can occur readily depending on the time constant determined by the product of the parasitic capacitance of silicon carbide semiconductor chips 2a and 2b and the parasitic inductance of the semiconductor device. Since the semiconductor device of this embodiment minimizes an increase in parasitic inductance, the semiconductor chips 2a and 2b can operate with a higher switching rate.

It is generally hard to increase the chip area of silicon carbide semiconductor chips 2a and 2b because of limitations in respect of the production yield rate. To achieve a large current capacity, therefore, it is preferable to make a plurality of semiconductor chips 2a and 2b operate in parallel. Even in this case, according to the embodiment, the mounting area of the semiconductor device and the parasitic inductance can both be reduced. A smaller mounting area means a lower stress inside the semiconductor device. For example, the stress generated by a difference in thermal expansion coefficient between the semiconductor chips 2a and 2b and surrounding components can be reduced even when silicon carbide having a high Young's modulus is used for the semiconductor chips 2a and 2b. As a result, the reliability of the semiconductor device can be improved.

REFERENCE SIGNS LIST 1a, 1b conductive substrate; 2a, 2b semiconductor chip; 4, 5, 6 lead frame; 4a, 5a, 6a bonded part; 4b, 5b, 6b upright part; 4c, 6c stress reducing part; 7 insulating substrate; 8 cooling plate; 9 protrusion; 10 case; 11a, 11b control terminal; 12a, 12b lead; 13 sealing material

The invention claimed is:

1. A semiconductor device comprising:
a conductive substrate;
at least one semiconductor chip bonded to an upper surface of the conductive substrate;
a control terminal disposed outside the semiconductor chip and connected to a control electrode of the semiconductor chip via a lead;
a case surrounding the semiconductor chip;
at least one lead frame; and
a sealing material sealing the semiconductor chip,
wherein the lead frame includes
a bonded part joined to the semiconductor chip, and
an upright part embedded in the case, extending from the bonded part to an outer side of the control terminal, and standing upright vertically relative to an upper surface of the semiconductor chip, and
at least part of the upright part is formed inside of the control terminal.

2. The semiconductor device according to claim 1, wherein the upright part is formed from inside to outside of the control terminal.

3. The semiconductor device according to claim 1, wherein the lead frame includes a stress reducing part connecting the bonded part and the upright part and reducing stress applied to the semiconductor chip.

4. The semiconductor device according to claim 1, wherein the at least one semiconductor chip includes a first semiconductor chip forming an upper arm and a second semiconductor chip forming a lower arm,
the at least one lead frame includes a first lead frame electrically connected to the first semiconductor chip and a second lead frame electrically connected to the second semiconductor chip, and
the upright part of the first lead frame and the upright part of the second lead frame face each other via an insulating layer.

5. The semiconductor device according to claim 1, wherein the lead frame is integrated with the case.

6. The semiconductor device according to claim 1, wherein the lead frame is fitted to the case.

7. The semiconductor device according to claim 1, wherein the upright part of the lead frame is bent in a U-shape.

8. The semiconductor device according to claim 1, wherein the at least one semiconductor chip includes a plurality of semiconductor chips connected in parallel for one switching phase, and
the lead frame draws one AC output from the plurality of semiconductor chips.

9. The semiconductor device according to claim 1, further comprising an insulating substrate provided on an underside of the conductive substrate.

10. The semiconductor device according to claim 9, further comprising a cooling plate provided on an underside of the insulating substrate.

11. The semiconductor device according to claim 10, further comprising a plurality of protrusions provided on an underside of the cooling plate for cooling purposes.

12. The semiconductor device according to claim 10, wherein the cooling plate is thermally coupled to a cooling fin via heat dissipation grease.

13. The semiconductor device according to claim 1, wherein the lead frame is covered by the sealing material.

14. The semiconductor device according to claim 1, wherein the at least one semiconductor chip includes a wide band gap semiconductor having a bandgap wider than a bandgap of silicon.

15. An inverter unit comprising the semiconductor device according to claim 1 and installed in an automobile housing as a power source for driving an automobile motor.

16. An automobile comprising:
an inverter unit installed in a housing of the automobile as a power source for driving a motor of the automobile, the inverter unit including a semiconductor device comprising:
a conductive substrate;
at least one semiconductor chip bonded to an upper surface of the conductive substrate;
a control terminal disposed outside the semiconductor chip and connected to a control electrode of the semiconductor chip via a lead;
a case surrounding the semiconductor chip;
at least one lead frame; and
a sealing material sealing the semiconductor chip,
wherein the lead frame includes
a bonded part joined to the semiconductor chip, and
an upright part embedded in the case, extending from the bonded part to an outer side of the control terminal, and standing upright vertically relative to an upper surface of the semiconductor chip, and
at least part of the upright part is formed inside of the control terminal.

* * * * *